United States Patent
Kuwazawa

(10) Patent No.: US 8,183,657 B2
(45) Date of Patent: May 22, 2012

(54) SOLID STATE IMAGING DEVICE COMPRISING CHARGE RETENTION REGION AND BURIED LAYER BELOW GATE

(75) Inventor: Kazunobu Kuwazawa, Nagano (JP)

(73) Assignee: Seiko Epson Corporation (JP)

( * ) Notice: Subject to any disclaimer, the term of this patent is extended or adjusted under 35 U.S.C. 154(b) by 2015 days.

(21) Appl. No.: 11/227,022

(22) Filed: Sep. 15, 2005

(65) Prior Publication Data

US 2006/0086996 A1 Apr. 27, 2006

(30) Foreign Application Priority Data

Oct. 25, 2004 (JP) ................................. 2004-309134

(51) Int. Cl.
*H01L 31/0352* (2006.01)
(52) U.S. Cl. ................................. 257/443; 257/E31.037
(58) Field of Classification Search .................. 257/431, 257/436, 443, 445, 450, 461, 465, E31.001, 257/E31.002, E31.032, E31.037, E31.038, 257/E31.039
See application file for complete search history.

(56) References Cited

U.S. PATENT DOCUMENTS

2004/0099886 A1* 5/2004 Rhodes et al. ................ 257/222

FOREIGN PATENT DOCUMENTS

| JP | 11-274461 | 10/1999 |
|---|---|---|
| JP | 2002-134729 | 5/2002 |
| JP | 2002-368201 | 12/2002 |
| JP | 2003-333431 | 11/2003 |

OTHER PUBLICATIONS

English-Language machine translation of JP 2002-1134729. Retreived on Oct. 12, 2011 from JPO webpage.*

* cited by examiner

*Primary Examiner* — Samuel Gebremariam
*Assistant Examiner* — Andrew O Arena
(74) *Attorney, Agent, or Firm* — Harness, Dickey & Piercem P.L.C.

(57) ABSTRACT

A solid state imaging device, includes: a sensor cell array having a plurality of sensor cells arranged in a matrix on a substrate, each sensor cell including: a photoelectric transducer provided in the substrate and generating photo-generated electric charges according to an incident light; a transfer gate formed on the substrate with a gate insulating layer therebetween; a charge retention region formed under the gate insulating layer and storing the photo-generated electric charges that are transferred from the photoelectric transducer by applying a predetermined potential to the transfer gate; a buried layer formed between the charge retention region and the gate insulating layer; and a floating diffusion storing the photo-generated electric charges that are transferred from the charge retention region by applying a predetermined potential to the transfer gate.

8 Claims, 4 Drawing Sheets

SOLID STATE IMAGING DEVICE COMPRISING CHARGE RETENTION REGION AND BURIED LAYER BELOW GATE

BACKGROUND OF THE INVENTION

1. Technical Field

The present invention relates to a solid state imaging device with a high quality image property and low power consumption.

2. Related Art

As solid state imaging devices mounted in cellular phones, digital cameras and the like, there are a charge coupled device (CCD) type image sensor and a complementary metal-oxide semiconductor (CMOS) type image sensor.

In recent years, a MOS type solid state imaging device (hereinafter called "substrate modulation type sensor") employing a threshold voltage modulation method has been proposed. Japanese Unexamined Patent Publication No. 2002-134729 is a first example of related art. The substrate modulation type sensor has a high quality image property and a low power consumption property. Such substrate modulation type sensor is disclosed in the first example.

The CCD sensor has a correlated double sampling (CDS) function and a so-called collective electronic shutter function for taking a fast moving object without making its image distort. In the collective electronic shutter function, a plurality of light receiving elements arranged in a matrix in plane simultaneously store electric charges that are generated by light. In this way, it can prevent the image of the moving object from being distorted. Accordingly, the CCD sensors generally have the advantage of a good image quality. However, the CCD sensors also have disadvantages of a high driving voltage and high power consumption.

On the other hand, the CMOS sensors generally consume less power and their process cost is low. However, it is impossible for the common CMOS sensors to realize both the collective electronic shutter function and the CDS function.

To explain this, an operation of the CMOS sensor is briefly described, taking a CMOS-APS (active pixel sensor) type that has four transistors as an example. Firstly, a floating diffusion, which is an electric charge storage area, is reset. Secondly, an electric potential based on the photo-generated electric charges remaining in the floating diffusion is outputted (readout of a noise component). After that, photo-generated electric charges generated by a photodiode are transferred to the floating diffusion. An electric potential based on the photo-generated electric charges transferred to the floating diffusion is then outputted (readout of a signal component). The CDS function is realized by taking a difference between these electric potential.

In the CDS, the readout of the signal has to be carried out right after the readout of the noise. As for the hitherto known CMOS sensors, the readout operation is performed with respect to each line so that the photo-generated electric charges have to be transferred to the floating diffusion line by line in order to realize the CDS. On the other hand, in order to realize the collective electronic shutter, the photo-generated electric charges in the all the pixels have to be transferred to the floating diffusion all at once. In other words, the transferring method of the photo-generated electric charges differs depending on the collective electronic shutter function or the CDS function.

When the photo-generated electric charges in all the pixels are transferred to the floating diffusion all at once in order to realize the collective electronic shutter function, the floating diffusion cannot be reset before the noise readout because the photo-generated electric charges are already stored in the floating diffusion. This means that the collective electronic shutter function and the CDS function cannot be realized at the same time.

Japanese Unexamined Patent Publication No. 2002-368201 is a second example of related art. In order to solve the above-mentioned problem, the second example discloses a technique that timing of the start and finish of a signal accumulation operation is synchronized in all the pixels. According to the second example, a charge retention region is provided right under a transfer gate, and a signal charge from the photodiode is once stored in the charge retention region and then transferred to the floating diffusion. In this way, the second example realizes the collective electronic shutter function.

However, in the device described in the second example, an N-type semiconductor region which serves as a signal charge retention region is formed on a semiconductor substrate surface. More specifically, the N type semiconductor region is formed so as to contact with a gate insulating layer. In this regard, there is a problem that electric charges tend to be generated and trapped in this contact area, and dark current tends to be generated.

Moreover, there is a possibility that a potential distribution in which some electric charges are left without being transferred is formed in a sectional structure disclosed in the second example.

SUMMARY

An advantage of the present invention is to provide a solid-state imaging device in which a buried layer having a different conductive type from that of the charge retention region is formed on the substrate surface in the charge retention region. The solid-state imaging device can inhibit the dark current from being generated and can reduce the electric charges left without being transferred.

According to a first aspect of the invention, a solid state imaging device includes a sensor cell array having a plurality of sensor cells arranged in a matrix on a substrate. Each sensor cell includes a photoelectric transducer provided in the substrate and generating photo-generated electric charges according to an incident light, a transfer gate formed on the substrate with a gate insulating layer therebetween, a charge retention region formed under the gate insulating layer and storing the photo-generated electric charges that are transferred from the photoelectric transducer by applying a predetermined potential to the transfer gate, a buried layer formed between the charge retention region and the gate insulating layer and a floating diffusion storing the photo-generated electric charges that are transferred from the charge retention region by applying a predetermined potential to the transfer gate.

According to the first aspect of the invention, the photo-generated electric charges from the photoelectric transducer are once retained in the charge retention region and then stored in the floating diffusion. Thereby, it is possible to realize both the collective electronic shutter function and the CDS function at the same time.

Furthermore, the buried layer is formed between the charge retention region and the gate insulating layer. This buried layer can inhibit the dark current from being generated and roughness of an image can be improved.

According to a second aspect of the invention, a solid state imaging device includes a sensor cell array having a plurality of sensor cells arranged in a matrix on a semiconductor region. Each sensor cell includes a photoelectric transducer having a first conductive type semiconductor region and a first impurity layer of a second conductive type, a transfer gate formed above the semiconductor region with a gate insulating layer therebetween, a second impurity layer of the second conductive type formed under the gate insulating layer and capacitively coupled to the transfer gate, a third impurity layer of the first conductive type formed between the second impurity layer and the gate insulating layer and a floating diffusion of the second conductive type formed adjacent to the transfer gate.

According to the second aspect of the invention, the photo-generated electric charges from the photoelectric transducer are once retained in the second impurity layer of the second conductive type and then stored in the floating diffusion. Thereby, it is possible to realize both the collective electronic shutter function and the CDS function at the same time.

Moreover, the third impurity layer of the first conductive type is formed between the second impurity layer of the second conductive type and the gate insulating layer. This third impurity layer of the first conductive type can inhibit the dark current from being generated and roughness of an image can be improved.

BRIEF DESCRIPTION OF THE DRAWINGS

The invention will be described with reference to the accompanying drawings, wherein like numbers refer to like elements, and wherein.

DESCRIPTION OF THE EMBODIMENTS

Figure 1:
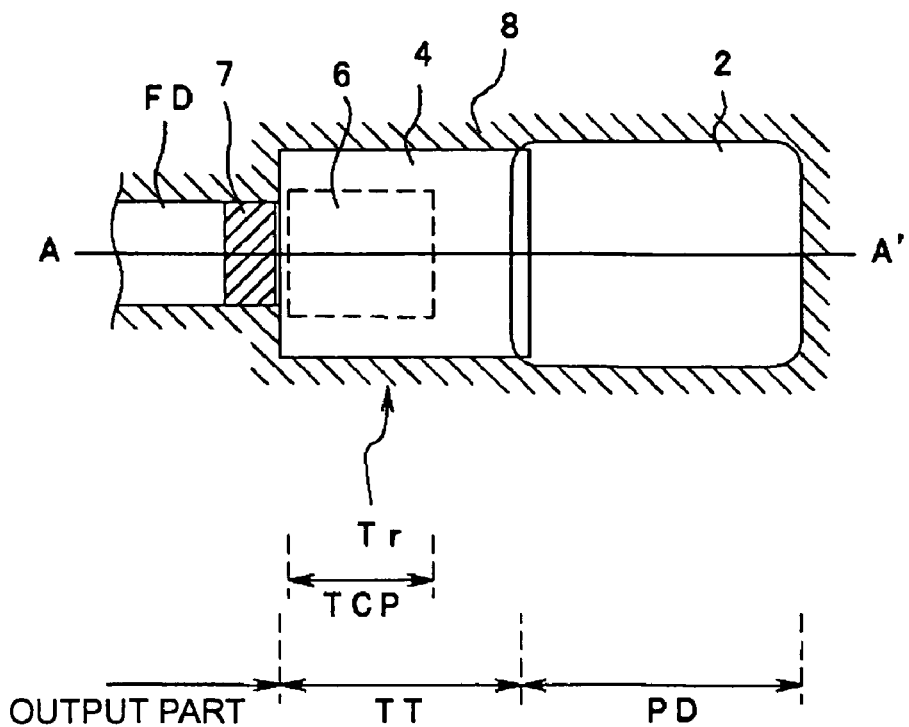
FIG. 1 is a plan view of a solid state imaging device according to a first embodiment of the invention showing its planar shape.
Figure 2:
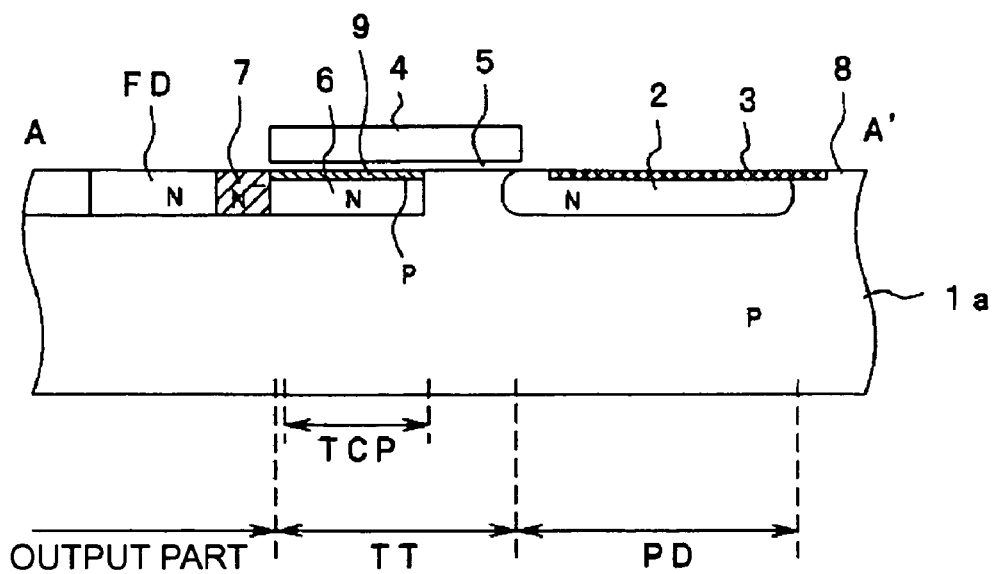
FIG. 2 is a sectional view along the line A-A' in FIG. 1.

Embodiments of the invention will now be described with reference to the drawings. FIG. 1 is a plan view of a solid-state imaging device according to a first embodiment of the invention showing its planar shape. FIG. 2 is a sectional view along the line A-A' in FIG. 1

The solid-state imaging device of this embodiment has a sensor cell array having a plurality of sensor cells arranged in a two-dimensional matrix on a substrate surface. FIG. 1 only shows a single sensor cell placed in the middle of the sensor cell array. Each sensor cell has the same structure. Each sensor cell includes a photodiode, a transfer part and an output part. The photodiode generates the photo-generated electric charges according to an incident light. The transfer part transfers the photo-generated electric charges generated by the photodiode. The output part includes the floating diffusion that stores the photo-generated electric charges transferred by the transfer part. The output part outputs an electric potential that depends on the photo-generated electric charges stored in the floating diffusion. FIG. 1 shows a photodiode forming region PD where the photodiode is formed, a transfer part forming region TT where the transfer region is formed and the floating diffusion FD in an output forming region where the output part is formed.

With the above-mentioned structure, each sensor cell can store the photo-generated electric charges generated according to the incident light and can output a pixel signal whose level depends on the stored photo-generated electric charges. The sensor cells are arranged in a matrix so that pixel signals for a screen can be obtained. Though electron is used as the photo-generated electric charges in this embodiment, electron hole can also be used to make up the above-mentioned structure.

In the output part, the floating diffusion FD and an unshown output transistor that outputs the electric potential depending on the photo-generated electric charges stored in the floating diffusion FD are formed.

As shown in FIG. 1, the floating diffusion FD which is an output part is provided in each sensor cell corresponding to the photodiode forming region PD. The transfer part forming region TT that transfers the photo-generated electric charges from the photodiode forming region PD to the floating diffusion FD is provided between the photodiode forming region PD and the floating diffusion FD.

In the transfer part forming region TT, a transfer gate 4 composing a transfer transistor is formed. A charge retention region TCP is also formed in the transfer part forming region TT. The charge retention region TCP is made of an impurity layer 6 that temporary stores the transferred photo-generated electric charges.

Next, the structure of the solid state imaging device according to the embodiments will now be described in detail with reference to FIG. 1 and FIG. 2. "N" and "P" in FIG. 2 and the following description designates the conductive type of impurities and the superscript "-" represents a region where the impurity concentration is relatively low.

The sensor cell is formed on a P-type semiconductor region 1a as shown in FIG. 2. Though the P-type semiconductor region is a P-type semiconductor substrate in this embodiment, it is not limited to this and it may be a P-type impurity region formed in the semiconductor substrate. In the photodiode forming region PD, an N-type impurity layer 2 is formed on a P-type semiconductor substrate 1a. The P-type semiconductor region 1a and the N-type impurity layer 2 forms the photodiode. A photoelectric transducer includes the P-type semiconductor region 1a and the N-type impurity layer 2. The N-type impurity layer 2 that forms the photoelectric transducer serves as a storage well 2 storing the photo-generated electric charges. A P-type impurity layer 3 that is electrically coupled to the P-type semiconductor substrate 1a is formed in the photodiode forming region PD on the substrate surface side. This impurity layer 3 serves as a pinning layer. In the photodiode forming region PD, an opening region is formed on the surface of a substrate 1 and the storage well 2 is formed under the opening region. The photodiode forming region PD is formed in, for example, a substantially rectangular shape as shown in FIG. 1.

On the other hand, in the output part, a N-type impurity layer, which is going to become the floating diffusion FD, is formed near the substrate surface.

In the area inferior to the opening region of the photodiode, a depletion layer extends from the boundary surface between the substrate 1a and the storage well 2 to the whole of the storage well 2 and the around the storage well 2. In the depletion layer, the photo-generated electric charges are generated by the light entered through the opening region. The generated electric charges are collected at the storage well 2. The electric charges stored in the storage well 2 is then transferred to the floating diffusion FD through the transfer part forming region TT which will be described next and held in the floating diffusion FD.

Next, the transfer part forming region TT is described. The transfer part forming region TT has the charge retention region TCP that temporary stores the photo-generated electric charges in the substrate as shown in FIG. 2. More specifically, the transfer part forming region TT is formed on the substrate surface side and between the photodiode forming region PD and the floating diffusion FD within the single sensor cell. The transfer part forming region TT has the transfer gate 4 on the substrate with a gate insulating layer 5 therebetween so as to form a channel on the substrate surface. Under the transfer gate 4, the N-type impurity layer 6 composing the charge retention region TCP is formed near the substrate surface. The N-type impurity layer 6 is capacitively coupled to the transfer gate 4.

An N-impurity layer 7 made of an N-type impurity is formed between the impurity layer 6 and the floating diffusion FD. The channel in the transfer part forming region TT or the transfer pathway is controlled by a voltage applied to the transfer gate 4. In this way, a potential barrier of the impurity layer 7 formed between the impurity layer 6 and the floating diffusion FD can be effectively controlled.

In this embodiment, a buried layer 9 made of the P-type impurity layer is formed on the substrate surface that contacts with the gate insulating layer 5 in the transfer part forming region TT as shown in FIG. 2. To be more specific, the whole top surface of the N-type impurity layer 6, which is the charge retention region, is covered with the P-type impurity layer 9 which is the buried layer. In other words, the impurity layer 6 does not contact with the gate insulating layer 5.

This buried layer 9 is electrically coupled to the substrate 1a so that it can serves as the pinning layer and can inhibit the dark current from being generated. It is known that the charges causing the dark current are generated in an area where crystallinity of the boundary surface between the silicon substrate 1a and the gate insulating layer 5 deteriorates. The pinning layer 9 can drain the electric charges into the substrate 1a without letting the charges flow into the impurity layer 6 which is going to be the charge storage area. Thereby, it can prevent the dark current from being generated.

Operation of the above-mentioned embodiment is now described.

The photo-generated electric charges are generated in the photoelectric transducer with the light that is entered though the opening region in the photodiode forming region PD. The generated electric charges are collected at the storage well 2. The electric charges collected at the storage well 2 are then transferred from the storage well 2 to the impurity layer 6 in the transfer part forming region TT when a predetermined voltage is applied to the transfer gate 4. The transferred charge is then retained in the impurity layer 6.

Moreover, in a case of transferring the photo-generated electric charges stored in the impurity layer 6 to the floating diffusion FD, a predetermined voltage is applied to the transfer gate 4. Thereby, the potential barrier of the impurity layer 7 becomes relatively lower than that of the impurity layer 6 so that the photo-generated electric charges stored in the impurity layer 6 are transferred to the floating diffusion FD.

The buried layer 9 is formed on the impurity layer 6 in this embodiment. Therefore, the whole top surface of the N-type impurity layer 6, which is the charge retention region, is covered with the P-type impurity layer 9 which is the buried layer. Thereby, it can prevent the dark current from being generated on the substrate surface under the gate insulating layer 5. Accordingly, it can prevent a noise component stems from the dark current from being retained in the impurity layer 6.

In this way, according to the embodiment, it can inhibit the dark current from being generated because the P-type impurity layer 9 serving as the pinning layer is formed on the substrate surface under the gate insulating layer. Therefore, the image quality, particularly, roughness of an image under the condition of darkness can be improved.

Figure 3:
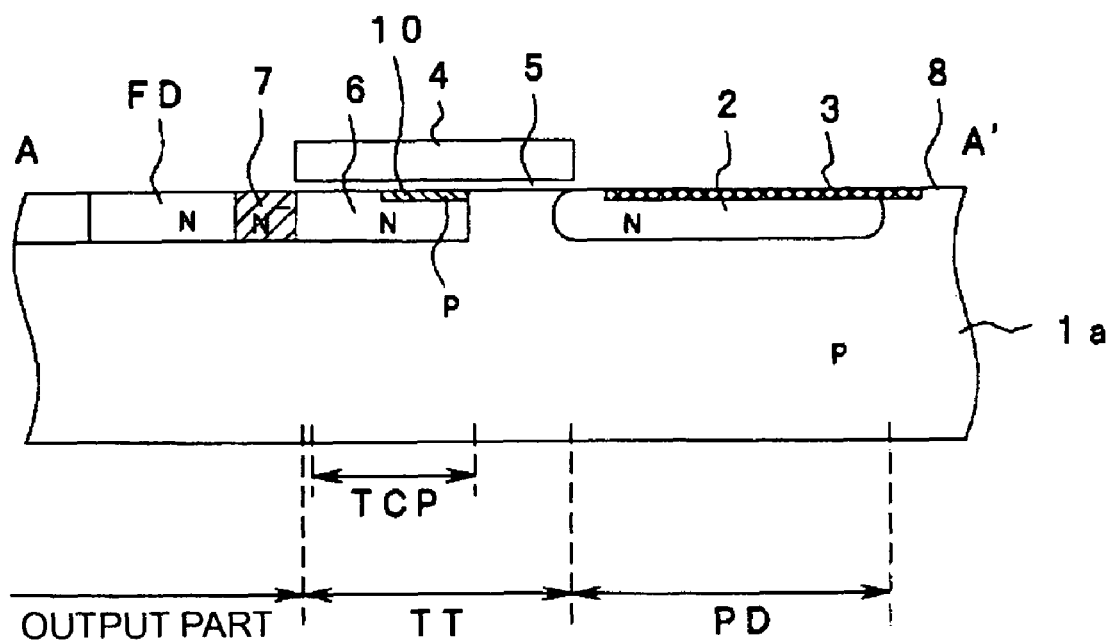
FIG. 3 is a sectional view showing a second embodiment of the invention.

FIG. 3 is a sectional view showing a second embodiment of the invention. In FIG. 3, the identical numerals are given to the same structures as those in FIG. 2 and those explanations will be omitted.

The first embodiment is for preventing the generation of the dark current. The second embodiment is for reducing the electric charges left without being transferred. The second embodiment is different from the first embodiment in that a buried layer 10 is used instead of the buried layer 9.

The buried layer 10 is the P-type impurity layer and formed on the photodiode forming region PD side of the substrate surface that contacts with the gate insulating layer 5 in the transfer part forming region TT. This means that at least a part of the top surface of the N-type impurity layer 6, which is the charge retention region, is covered with the P-type impurity layer 10 which is the buried layer. In other words, the impurity layer 6 does not contact with the gate insulating layer 5 in the area where the buried layer 10 is formed. As shown in FIG. 3, at least a part of the top surface of the N-type impurity layer 6, which is the charge retention region, is covered with the P-type impurity layer 10 which is the buried layer on the side of the photoelectric transducer PD. Moreover, at least a part of the top surface of the N-type impurity layer 6 which is the charge retention region contacts with the gate insulating layer 5 on the side of the floating diffusion FD.

In this way, the buried layer 10 can serves as the pinning layer. Therefore, it is possible to inhibit the dark current from being generated in some area in the charge retention region TCP on the side of the photoelectric transducer PD.

Furthermore, the area where the P-type buried layer 10 is formed on the N-type impurity layer 6 has a relatively high potential compared with other area where the buried layer 10 is not formed in the charge retention region TCP. Therefore, the potential declines as position changes in a direction from the photodiode forming region PD toward the impurity layer 7 in the charge retention region TCP. Thereby, the transfer of the photo-generated electric charges retained in the charge retention region 6 to the floating diffusion FD is facilitated and the amount of the electric charges left without being transferred can be reduced.

Figure 4A:
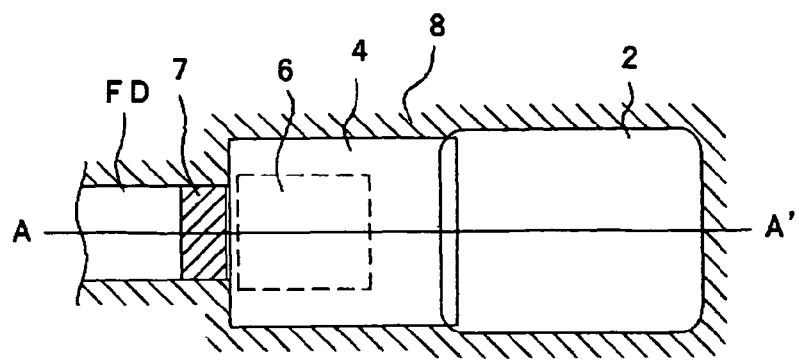
FIG. 4 is an explanatory drawing for explaining a potential of a sensor cell according to the embodiment.
Figure 4B:
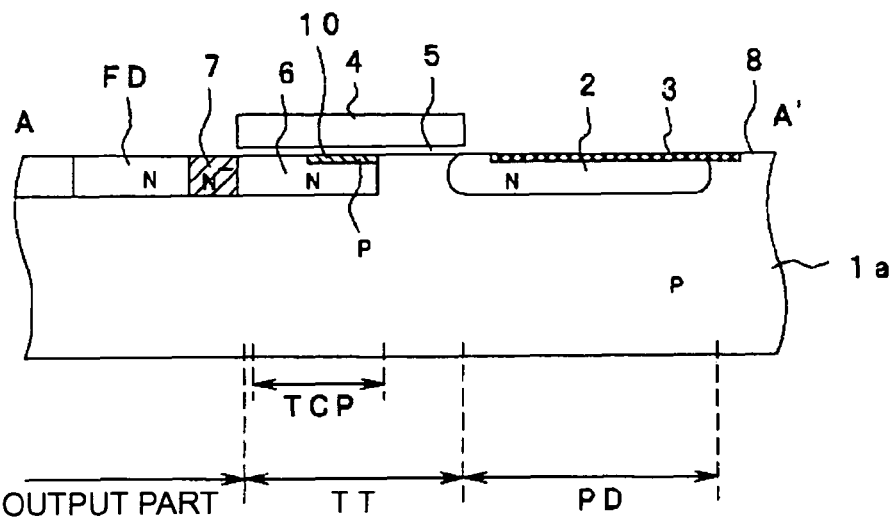
Figure 4C:
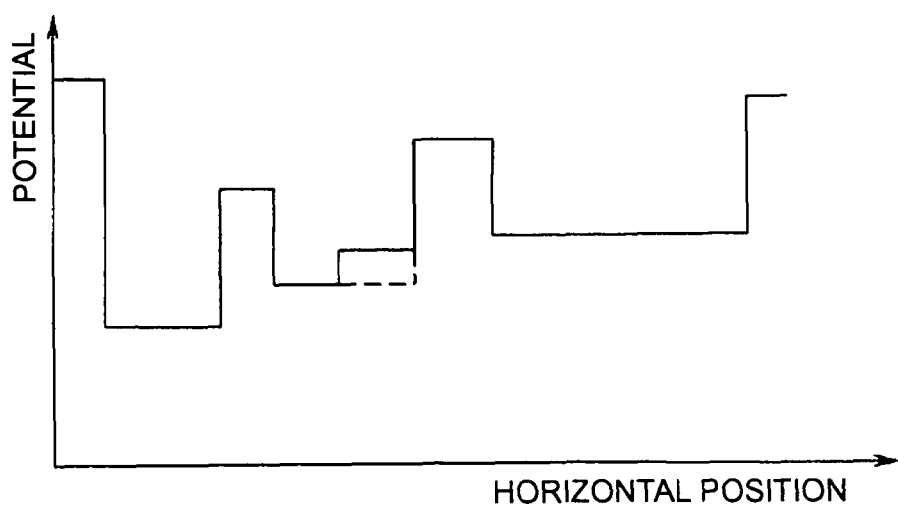
Figure 5A:
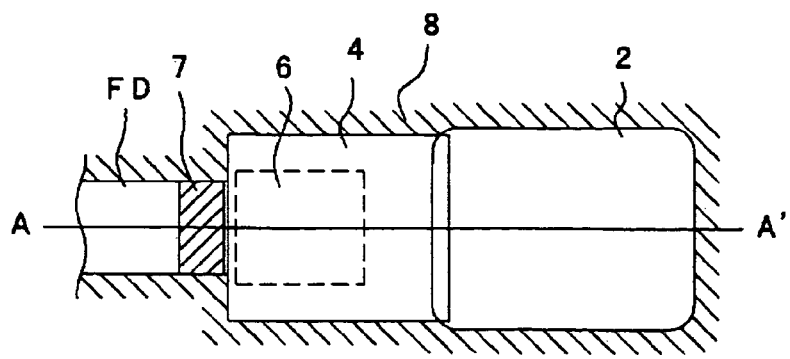
FIG. 5 is an explanatory drawing of a sensor cell disclosed in the second example of related art.
Figure 5B:
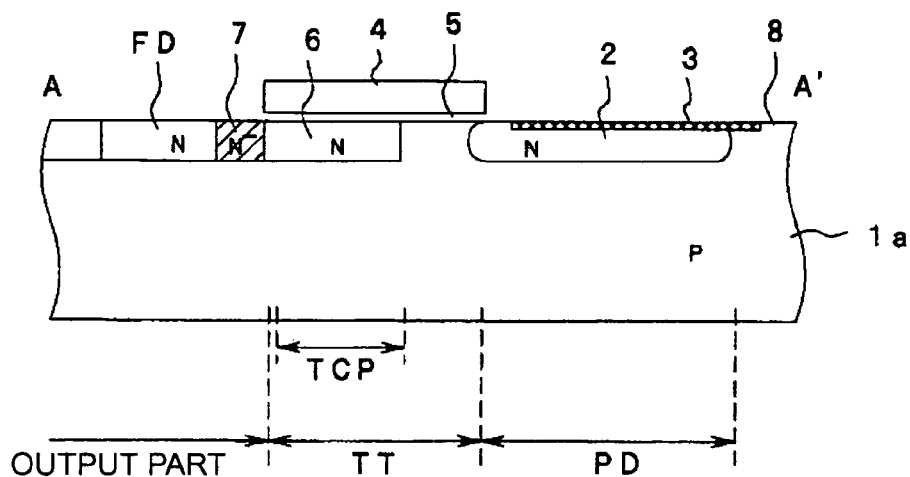
Figure 5C:
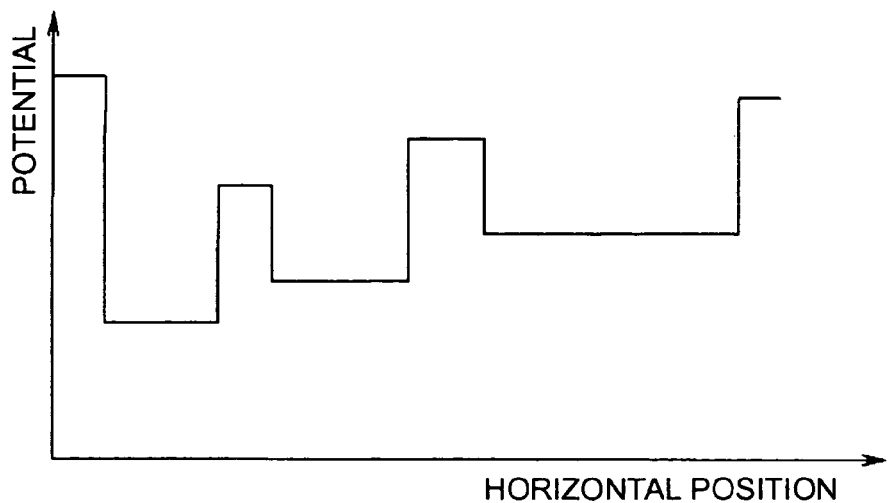

Next, operation of such embodiment is described with reference to FIG. 4 and FIG. 5. FIG. 4 is an explanatory drawing for explaining a potential of the sensor cell according to the embodiment. FIG. 4A shows a planar shape of the solid-state imaging device according to the second embodiment to the same extent as FIG. 1. FIG. 4B is a sectional view along the line A-A' in FIG. 4A. FIG. 4C shows a potential change according to a position. The horizontal axis is a position along the line A-A' in FIG. 4A and the vertical axis is the potential. FIG. 5 is an explanatory drawing of a sensor cell disclosed in the second example of related art. FIGS. 5A though 5C respectively corresponds to FIGS. 4A though 4C showing a planer shape, a sectional shape and a potential change of the sensor cell disclosed in the second example. In FIG. 5, the identical numerals are given to the same structures and components as those in FIG. 4 and those explanations will be omitted. In FIG. 4 and FIG. 5, the direction where the potential of an electron increases is set as a positive direction in the potential change.

This embodiment can also inhibit the dark current from being generated with the buried layer 10. The buried layer 10 is formed on the impurity layer 6 and a part of the substrate surface under the gate insulating layer 5 is covered with the P-type buried layer 10. Thereby, the generation of the dark current at the substrate surface under the gate insulating layer 5 can be prevented.

Next, a driving method which can satisfy both the CDS function and the collective electronic shutter function at the same time will be described in this embodiment. Though the following embodiment is described based on the second embodiment, the embodiment can also be applied to the first embodiment except that the potential form that stems from the buried layer is slightly different.

In this embodiment, a frame period includes four kinds of period; a reset period, a storage period, a collective transfer period and a pixel signal readout period.

The reset period is an all-cell reset period for which all the pixels or all the sensor cells are reset at the same time at the beginning of a frame. A reset operation is performed in the reset period. By the reset operation, electric charges remaining in the storage well 2, the impurity layer 6 and the floating diffusion FD in each pixel are drained. After the reset operation, electric charges are started to be stored in the storage well 2 in each sensor cell.

The storage period followed by the reset period is a period in which each sensor cell turns to be a storage mode and the photo-generated electric charges come up in the photodiode forming region PD with the light is stored in the storage well 2.

A relatively high potential barrier is formed between the photodiode forming region PD and the charge retention region TCP as shown in FIG. 4. The photo-generated electric charges generated in the photodiode forming region PD are stored in the storage well 2 without flowing into the impurity layer 6.

The collective transfer period followed by the storage period is a period in which each sensor cell turns to be a collective transfer mode and a collective transfer is performed. In the collective transfer, the electric charges stored in the photodiode forming region PD in all the pixels or all the sensor cells are simultaneously transferred to the corresponding charge retention region TCP in each sensor cell.

In the collective transfer period, a predetermined voltage is applied to the transfer gate 4. This decreases the potential of the potential barrier between the storage well 2 and the impurity layer 6 (not shown in the figures).

The potential of the impurity layer 6 is set to be low compared with the potential of the storage well 2 and the photo-generated electric charges generated in the photodiode forming region PD is transferred in batch to the impurity layer 6 in the transfer part forming region TT and retained there.

When the collective transfer period ends, the pixel signal readout period begins. The readout of the pixel signal is performed in a horizontal blanking period that is sequentially set with respect to each line. In other words, the horizontal blanking period is sequentially generated or consecutively generated at different times with respect to each line from the first line to the last line. Each blanking period includes the reset period, a noise component and signal component readout period.

In the noise component and signal component readout period, firstly, a noise component that exists in the floating diffusion FD is read out while the potential barrier of the impurity layer 7 is high as shown in FIG. 4C. Thereby, electric charges in the floating diffusion FD are drained out and the potential of the floating diffusion FD becomes a default value.

Next, the electric charges retained in the charge retention region TCP are transferred to the floating diffusion FD in the selected line in the horizontal blanking period. This means that the potential barrier of the impurity layer 7 gets lowered compared with that of the impurity layer 6 (not shown in the figures) by applying a predetermined voltage to the transfer gate 4 and the photo-generated electric charges retained in the impurity layer 6 are transferred to the floating diffusion FD. Subsequently, the signal component is read out. Then, the potential barrier of the impurity layer 7 is again made high by applying a predetermined voltage to the transfer gate 4.

Meanwhile, a sensor cell, which can be developed based on the idea disclosed in the second example of related art, has the same structure as the one shown in FIG. 4 except that the buried layer 10 is removed as shown in FIG. 5A and has a uniform potential distribution within the charge retention region TCP. For this reason, the photo-generated electric charges is not easily transferred at the time of the transfer from the impurity layer 6 to the floating diffusion FD and the charge tends to remain without being transferred.

On the other hand, according to the embodiment, the P-type buried layer 10 is formed on the N-type impurity layer 6 and the buried layer 10 formed region side has a higher potential than any other area in the charge retention region TCP. Because the buried layer 10 is formed on the side of the photodiode forming region PD, the potential decreases as the position changes toward the floating diffusion FD from the photodiode forming region PD in the charge retention region TCP.

FIG. 4C shows the potential change. The dashed line in FIG. 4 shows the same characteristics as that of the FIG. 5C and the continuous line shows the characteristics of the embodiment. It can tell from FIG. 4C that the potential decreases as the position changes from the photodiode forming region PD toward the floating diffusion FD in the charge retention region TCP according to the embodiment.

In this way, the photo-generated electric charge temporary stored in the impurity layer 6 is comparatively easily transferred to the floating diffusion FD by lowering the potential barrier in the impurity layer 7 and this likely prevent the charges from being left without being transferred.

As described above, according to the embodiments of the invention, a first conductive type buried layer is formed on a top surface of a second conductive type impurity layer that composes the charge retention region. Accordingly, it is possible to inhibit the dark current from being generated and roughness of an image can be improved. Furthermore, the buried layer is formed on the photodiode forming region side of the substrate surface. Thereby, it is possible to give the potential distribution in which the potential decreases as the position changes from the photodiode forming region toward the floating diffusion to the charge retention region. In this way, the transfer of the electric charges from the impurity region to the floating diffusion is facilitated and this can prevent the charge from being left without being transferred. As a result, an image signal of a high quality image can be obtained according to the solid state imaging device of the above-described embodiments.

Although the embodiments of the invention have been fully described by way of example with reference to the accompanying drawings, it is to be understood that the embodiments described hereunder do not in any way limit the scope of the invention but various changes and modifications will be applied within the scope and spirit of the invention.

What is claimed is:
1. A solid state imaging device, comprising:
 a sensor cell array having a plurality of sensor cells arranged in a matrix on a substrate having a first conductivity type, each sensor cell including:

a photoelectric transducer provided in the substrate and generating photo-generated electric charges according to an incident light;

a transfer gate formed on the substrate with a gate insulating layer therebetween;

a charge retention region having a second conductivity type formed under the gate insulating layer and storing the photo-generated electric charges that are transferred from the photoelectric transducer by applying a predetermined potential to the transfer gate;

a buried layer having the first conductivity type formed under the gate insulating layer and directly above and in direct contact with the charge retention region such that the buried layer is arranged between the charge retention region and the gate insulating layer; and a floating diffusion having the second conductivity type storing the photo-generated electric charges that are transferred from the charge retention region by applying a predetermined potential to the transfer gate, wherein at least a part of a top surface of the charge retention region is covered with the buried layer.

2. The solid state imaging device according to claim 1, wherein the whole of a top surface of the charge retention region is covered with the buried layer.

3. The solid state imaging device according to claim 1, wherein at least a part of the top surface of the charge retention region contacts with the gate insulating layer.

4. The solid state imaging device according to claim 3, wherein at least a part of the top surface of the charge retention region on the photoelectric transducer side is covered with the buried layer and at least a part of the top surface of the charge retention region on the floating diffusion side contacts with the gate insulating layer.

5. A solid state imaging device, comprising:
a sensor cell array having a plurality of sensor cells arranged in a matrix on a semiconductor region, each sensor cell including:

a photoelectric transducer having a first conductive type semiconductor region and a first impurity layer of a second conductive type;

a transfer gate formed above the semiconductor region with a gate insulating layer therebetween;

a second impurity layer of the second conductive type formed under the gate insulating layer and capacitively coupled to the transfer gate;

a third impurity layer of the first conductive type formed under the gate insulating layer and directly above and in direct contact with the second impurity layer such that the third impurity layer is arranged between the second impurity layer and the gate insulating layer; and a floating diffusion of the second conductive type formed adjacent to the transfer gate, wherein at least a part of a top surface of the second impurity layer is covered with the third impurity layer.

6. The solid state imaging device according to claim 5, wherein the whole of a top surface of the second impurity layer is covered with the third impurity layer.

7. The solid state imaging device according to claim 5, wherein at least a part of the top surface of the second impurity layer contacts with the gate insulating layer.

8. The solid state imaging device according to claim 7, wherein at least a part of the top surface of the second impurity layer on the photoelectric transducer side is covered with the third impurity layer and at least a part of the top surface of the second impurity layer on the floating diffusion side contacts with the gate insulating layer.

* * * * *